United States Patent
Singh

(10) Patent No.: US 11,152,899 B2
(45) Date of Patent: Oct. 19, 2021

(54) MULTI-STAGE AMPLIFIER INCLUDING A PRE-DRIVER STAGE

(71) Applicant: Texas Instruments Incorporated, Dallas, TX (US)

(72) Inventor: Ravpreet Singh, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 90 days.

(21) Appl. No.: 16/601,655

(22) Filed: Oct. 15, 2019

(65) Prior Publication Data
US 2021/0111677 A1     Apr. 15, 2021

(51) Int. Cl.
H03F 3/21       (2006.01)
H03F 3/68       (2006.01)
H03F 3/24       (2006.01)

(52) U.S. Cl.
CPC ............ *H03F 3/211* (2013.01); *H03F 3/245* (2013.01); *H03F 3/68* (2013.01); *H03F 2203/21127* (2013.01)

(58) Field of Classification Search
CPC . H03F 3/211; H03F 3/68; H03F 3/245; H03F 2203/21127
USPC .................................................. 330/252–261
See application file for complete search history.

(56) References Cited

U.S. PATENT DOCUMENTS 7,557,659 B2 * 7/2009 Harvey ................. H03F 3/4508
330/255

* cited by examiner

*Primary Examiner* — Hieu P Nguyen
(74) *Attorney, Agent, or Firm* — John R. Pessetto; Charles A. Brill

(57) ABSTRACT

A multi-stage amplifier including a pre-driver stage, and method of operating the same. In one example, the amplifier includes an output stage with a first output transistor coupled to an oppositely doped second output transistor and to an output terminal. The pre-driver stage includes with a first driver transistor coupled to the first output transistor, and a second driver transistor coupled to the second output transistor. The pre-driver stage also includes a first current mirror and a second current mirror coupled to the first driver transistor and the second driver transistor. The pre-driver stage also includes a first translinear loop having a first translinear loop transistor and a second translinear loop having a second translinear loop transistor coupled to the first output transistor and the second output transistor.

17 Claims, 4 Drawing Sheets

MULTI-STAGE AMPLIFIER INCLUDING A PRE-DRIVER STAGE

TECHNICAL FIELD

The present disclosure is directed to, in general, to amplifiers and, more specifically, to a multi-stage amplifier including a pre-driver stage, and method of operating the same.

BACKGROUND

Electronic amplifiers employing bipolar junction transistor ("BJT") technologies are designed to operate with output signals having peak amplitudes that approach upper and lower power supply rails. To achieve high open-loop gains of, for instance, 100 decibels ("dB") or more, typically three stages of cascaded amplifiers include an input signal conditioner, an intermediate pre-driver stage, and a final output stage. To achieve rail-to-rail operation, the output stage is typically configured as a common emitter type amplifier, and the pre-driver stage is commonly configured as a high output impedance Class AB stage to provide the load dependent base current of the output stage. This configuration provides both high open-loop gain and rail-to-rail output signal capability. However, this combination employs a nested Miller feedback loop to stabilize the amplifier, which can limit the useful bandwidth of the amplifier. The nested Miller feedback loop uses of multiple capacitors and feedback paths and also reduces the amplifiers' open-loop gain. Extending the bandwidth of an amplifier while also maintaining high open-loop gain is advantageous in many applications.

Accordingly, an apparatus and method of operating the same for stabilizing a multi-stage amplifier without sacrificing open-loop gain would be beneficial.

SUMMARY

These and other problems are generally solved, or circumvented, and technical advantages are generally achieved, by advantageous examples of the present disclosure which includes a multi-stage amplifier including a pre-driver stage, and method of operating the same. In one example, the amplifier includes an output stage with a first output transistor having a collector coupled to a collector of an oppositely doped second output transistor and to an output terminal. The amplifier also includes a pre-driver stage with a first driver transistor having an emitter coupled to a base of the first output transistor, and a second driver transistor having an emitter coupled to a base of the second output transistor. The pre-driver stage also includes a first current mirror including a first current sensing branch coupled to a collector of the second driver transistor and a first current output branch coupled to an emitter of the first driver transistor. A second current mirror of the pre-driver stage includes a second current sensing branch coupled to a collector of the first driver transistor and a second current output branch coupled to an emitter of the second driver transistor.

The pre-driver stage also includes a first translinear loop having a first translinear loop transistor with an emitter coupled to the base of the first output transistor and a collector coupled to the base of the second output transistor, a first series diode pair coupled between the first power supply bus and a base of the first translinear loop transistor, and a second series diode pair coupled between the base of the first translinear loop transistor and the second power supply bus. A second translinear loop of the pre-driver stage includes a second translinear loop transistor with an emitter coupled to the base of the second output transistor and a collector coupled to the base of the first output transistor, a third series diode pair coupled between the second power supply bus and a base of the second translinear loop transistor, and a fourth series diode pair coupled between the base of the second translinear loop transistor and the first power supply bus.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated that the specific examples disclosed may be readily utilized as a basis for modifying or designing other structures or processes for carrying out the same purposes of the present disclosure. It should also be realized that such equivalent constructions do not depart from the spirit and scope of the disclosure as set forth in the appended claims.

BRIEF DESCRIPTION OF THE DRAWINGS

For a more complete understanding of the present disclosure, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred examples and are not necessarily drawn to scale.

DETAILED DESCRIPTION

The making and using of the examples are discussed in detail below. It should be appreciated, however, that the present disclosure provides many applicable concepts that can be embodied in a wide variety of specific contexts. The specific examples discussed are merely illustrative of specific ways to make and use the disclosure, and do not limit the scope of the disclosure.

The present disclosure will be described with respect to examples in a specific context, namely, a multi-stage amplifier, and a method of operating the same. The principles of the present disclosure, however, may also be applied to other types of amplifiers employing various topologies that may benefit from the disclosed power/bandwidth improvements. Circuit elements described herein, although implemented in monolithic BJT semiconductor technology, may be implemented with a wide variety of discrete component physical examples, and may further be implemented with non-BJT semiconductor technologies.

Figure 1:
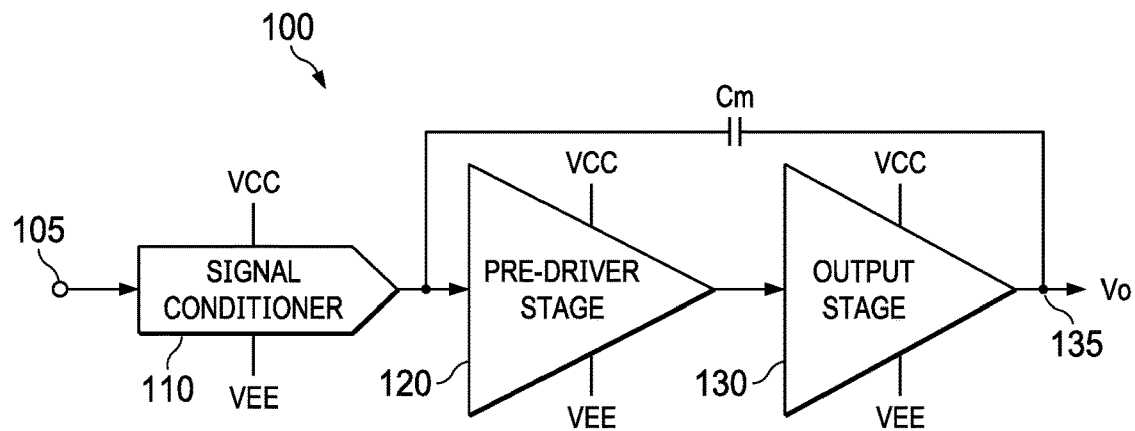
FIG. 1 illustrates a block diagram of an example of a multi-stage amplifier.

Referring initially to FIG. 1, illustrated is a block diagram of an example of a multi-stage amplifier (also referred to as an amplifier) 100. The amplifier 100 is couplable to a first power supply bus (e.g., a positive power supply bus) VCC and a second power supply bus (e.g., a negative and/or ground power supply bus) VEE that supplies operating electrical energy to the amplifier 100. The amplifier 100 includes a signal conditioner 110, a pre-driver stage 120 (e.g., a Class AB emitter follower pre-driver stage), and an output stage 130. An input terminal 105 provides an input signal to the signal conditioner 110. The signal conditioner 110 may perform any number of signal transformations or conditioning including, for instance, amplifying the input signal, and presents a conditioned signal to the pre-driver stage 120. The pre-driver stage 120 provides a gain of, for example, one (1) and provides a low impedance signal to the output stage 130. The output stage 130 provides further amplification of the input signal and provides an output signal Vo (e.g., an amplified output signal) to an output terminal 135. A Miller feedback loop includes a capacitor Cm to stabilize the operation of the amplifier 100 by providing a feedback path from the output terminal 135 to the input of the pre-driver stage 120. By utilizing a low output impedance pre-driver stage 120 with, for instance, a gain of one (1), a single capacitor Cm may be used to stabilize the tandem combination of pre-driver stage 120 and output stage 130.

Figure 2:
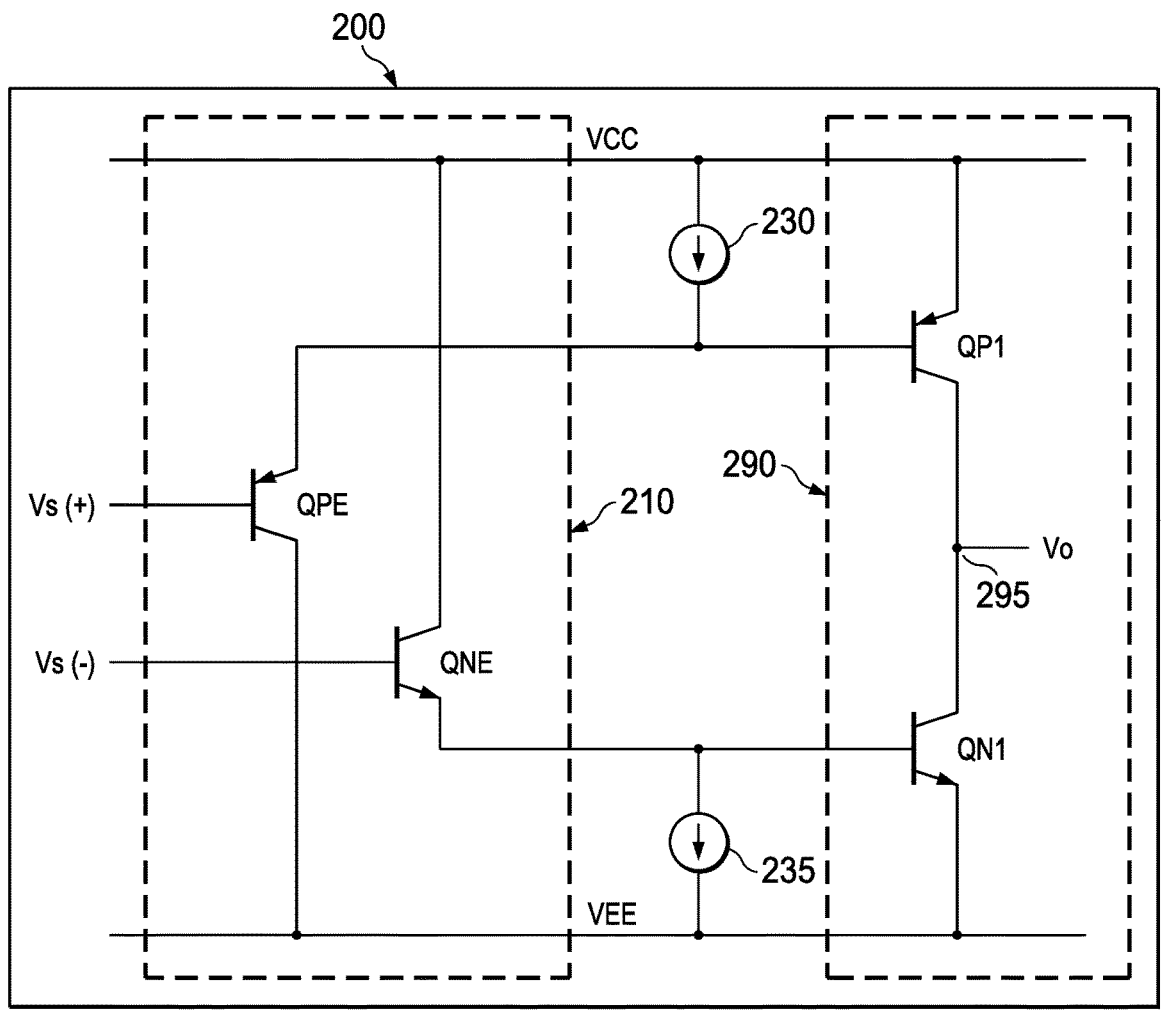
FIGS. 2 to 4 illustrate schematic diagrams of portions of example multi-stage amplifiers.

Turning now to FIG. 2, illustrated is a schematic diagram of a portion of an example multi-stage amplifier (also referred to as an amplifier) 200. The amplifier 200 includes a pre-driver stage 210 and an output stage 290. The pre-driver stage 210 is a bipolar-junction transistor ("BJT") implementation of a Class AB emitter follower pre-driver stage coupled to the rail-to-rail output stage 290. The low output impedance of the pre-driver stage 210 enables use of a single Miller feedback loop. The pre-driver stage 210 is biased with sufficient current for fast turn-off of the output stage 290. First and second driver transistors QPE, QNE of the pre-driver stage 210 are driven by two in-phase input voltage signals Vs(+), Vs(−), respectively, with appropriate dc levels. The input voltage signals Vs(+), Vs(−) may represent the conditioned signal from the signal conditioner 110 of FIG. 1. The dc shift therebetween sets the quiescent current in the output stage 290.

The output stage 290 is formed with a first output transistor QP1 (e.g., PNP transistor) with its emitter coupled to a first power supply bus VCC and a second output transistor QN1 (e.g., NPN transistor) with its emitter coupled to a second power supply bus VEE. The collectors of both the first and second output transistors QP1, QN1 are coupled together and also to an output terminal 295. The emitter of the first driver transistor QPE (e.g., PNP transistor) is coupled to a base of the first output transistor QP1 and a collector of the first driver transistor QPE is coupled to the second power supply bus VEE. The emitter of the second driver transistor QNE (e.g., NPN transistor) is coupled to a base of the second output transistor QN1 and a collector of the second driver transistor QNE is coupled to the first power supply bus VCC.

A first input voltage signal Vs(+) is provided to a base of the first driver transistor QPE and a second input voltage signal Vs(−) is provided to a base of the second driver transistor QNE. The first and second input voltage signals Vs(+), Vs(−) are in-phase input voltage signals separated by a dc offset voltage. The dc voltage level of the first input voltage signal Vs(+) sets the quiescent operating current in both the first driver transistor QPE and first output transistor QP1. The dc voltage level of the second input voltage signal Vs(−) sets the quiescent operating current in both the second driver transistor QNE and the second output transistor QN1.

A first current source 230 is sized to provide a dc bias current for the first driver transistor QPE and also provides a turn-off current for the first output transistor QP1. The first current source 230 is coupled between the first power supply bus VCC and the base of the first output transistor QP1. Depending on physical construction and power dissipation limitations of the first current source 230, the turn-off rate for the first output transistor QP1 may be limited. A second current source 235 is sized to provide a dc bias current for the second driver transistor QNE and also provide a turn-off current for the second output transistor QN1. The second current source 235 is coupled between the base of the second output transistor QN1 and the second power supply bus VEE. Depending on physical construction and power dissipation limitations of the second current source 235, the turn-off rate for the second output transistor QN1 may be limited.

The first and second output transistors QP1, QN1 are driven by the low impedance emitters of the first and second driver transistors QPE, QNE, respectively. As a result, the first and second output transistors QP1, QN1 receive low impedance signals from the first and second driver transistors QPE, QNE, respectively. This low impedance pre-driver arrangement allows the use a single Miller feedback loop to achieve overall amplifier stability over a reasonably broad band of operating frequencies. The output stage 290 transforms (e.g., amplifies) the low impedance signals from the first and second driver transistors QPE, QNE and provides an output signal Vo (e.g., an amplified output signal) at the output terminal 295.

The pre-driver stage 210 is a Class AB stage and presents a low output impedance to the input of the amplifier output stage 290, thus preserving a high open-loop gain and wide bandwidth while enabling the use a single Miller feedback loop for stability. The pre-driver stage 210 also provides a load-dependent base current of the output stage 290. If the pre-driver stage were synthesized as high output impedance stage, a nested-Miller feedback loop would be employed to stabilize the output stage 290. This limits the bandwidth of the conventional amplifiers. To increase (e.g., double) the bandwidth of a multi-stage amplifier without sacrificing its open-loop gain, the Class AB emitter follower pre-driver stage 210 as described herein enables the pre-driver stage 210 to have a low output impedance, and thus a single Miller feedback loop is employed for stability.

Figure 3:
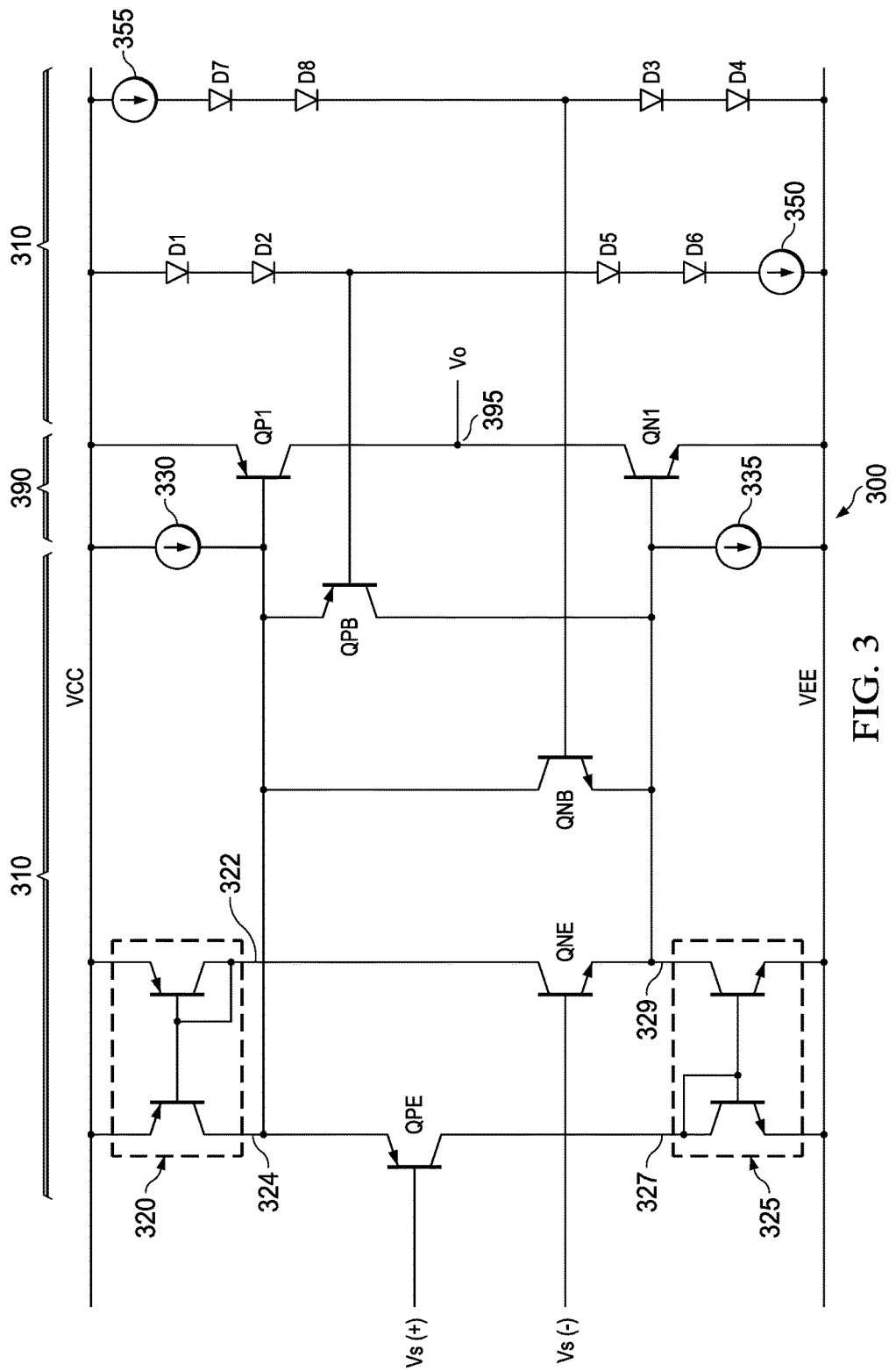

Turning now to FIG. 3, illustrated is a schematic diagram of a portion of an example multi-stage amplifier (also referred to as an amplifier) 300. The amplifier 300 includes a pre-driver stage 310 and an output stage 390 analogous to the amplifier 200 introduced with respect to FIG. 2. The pre-driver stage 310 includes first and second driver transistors QPE, QNE driven by two in-phase input voltage signals Vs(+), Vs(−), respectively, with appropriate dc levels. The pre-driver stage 310 is made Class AB emitter follower by coupling the currents of the first and second driver transistors QPE, QNE with positive current feedback. The rail-to-rail output stage 390 is formed with a first output transistor QP1 with its emitter coupled to a first power supply bus VCC and a second output transistor QN1 with its emitter coupled to a second power supply bus VEE. The collectors of both the first and second output transistors QP1, QN1 are coupled together and also to an output terminal 395.

The emitter of the first driver transistor QPE (e.g., PNP transistor) is coupled to a base of the first output transistor QP1 and a collector of the first driver transistor QPE is coupled to the second power supply bus VEE. The emitter of the second driver transistor QNE (e.g., NPN transistor) is coupled to a base of the second output transistor QN1 and a collector of the second driver transistor QNE is coupled to the first power supply bus VCC.

Analogous to the amplifier 200 of FIG. 2, a first current source 330 is sized to provide a dc bias current for the first driver transistor QPE and also provides a turn-off current for the first output transistor QP1. The first current source 330 is coupled between the first power supply bus VCC and the base of the first output transistor QP1. A second current source 335 is sized to provide a dc bias current for the second driver transistor QNE and also provide a turn-off current for the second output transistor QN1. The second current source 335 is coupled between the base of the second output transistor QN1 and the second power supply bus VEE. Thus, the pre-driver stage 310 receives the input voltage signals Vs(+), Vs(−) and provides low impedance signals to the output stage 390, which transforms the low impedance signals and provides an output signal Vo (e.g., an amplified output signal) at the output terminal 395 of the amplifier 300.

In addition to the circuit elements mentioned above, the pre-driver stage 310 includes first and second current mirrors 320, 325 to bias the pre-driver stage 310 for Class AB operation. The first current mirror 320 has its current sensing branch (a first current sensing branch 322) coupled between the collector of the second driver transistor QNE and the first power supply bus VCC. The first current mirror 320 further has its current output branch (a first current output branch 324) coupled between the emitter of the first driver transistor QPE and the first power supply bus VCC. The second current mirror 325 has its current sensing branch (a second current sensing branch 327) coupled between the collector of first driver transistor QPE and the second power supply bus VEE. The second current mirror 325 further has its current output branch (a second current output branch 329) coupled between the emitter of the second driver transistor QNE and the second power supply bus VEE.

As a current (a first sensed current) in the first current sensing branch 322 of the first current mirror 320 increases, the first current output branch 324 will drive, without limitation, a nearly identical amount of current (a first output current) into the emitter of the first driver transistor QPE. By transistor action, a similar current will flow in the collector of the first driver transistor QPE and in turn be driven into the second current sensing branch 327 of the second current mirror 325. As a current (a second sensed current) in the second current sensing branch 327 of the second current mirror 325 increases, the second current output branch 329 will drive, without limitation, a nearly identical amount of current (a second output current) into the emitter of the second driver transistor QNE. By transistor action, a similar current will flow in the collector of the second driver transistor QNE and in turn be driven into the first current sensing branch 322 of first current mirror 320.

This combined action creates a positive current feedback and drives apart the dc voltage levels of first and second input voltage signals Vs (+), Vs (−). The first input voltage signal Vs (+) will reach a dc voltage set by the first power supply bus VCC minus the forward biased base-emitter junction voltages of both the first driver transistor QPE and the first output transistor QP1. The second input voltage signal Vs (−) will reach a dc voltage set by the second power supply bus VEE plus the forward biased base-emitter junction voltages of both the second driver transistor QNE and the second output transistor QN1.

As a result, the first current mirror 320 is configured to alter a base current of the first output transistor QP1. The second current mirror 325 is configured to alter a base current of the second output transistor QN1. Thus, proper dc bias for Class AB operation of the pre-driver stage 310 is achieved, to control conduction overlap of the first and second output transistors QP1, QN1.

Additionally, the dc bias currents for the pre-driver stage 310 can now be provided by the first and second current mirrors 320, 325. This allows more current from a first current source 330 to turn off the first output transistor QP1 and achieve a faster turn-off rate. Also, more current from a second current source 335 is available to turn off the second output transistor QN1 and achieve a faster turn-off rate. Furthermore, the size of the first and second current sources 330, 335 may be made smaller while keeping constant the turn-off rate of the first and second output transistors QP1, QN1.

Due to the positive feedback mechanism of the first and second current mirrors 320, 325 used to achieve Class AB operation of the pre-driver stage 310, the loop gain at frequencies other than dc can be greater than one (1) and may pose a stability challenge. First and second translinear loops are added to divert current from a loop formed by the first and second current mirrors 320, 325 to reduce a loop gain thereof to less than one (1).

The first translinear loop includes a first translinear loop transistor QPB, a first series diode pair D1-D2, a second series diode pair D5-D6 and a first translinear loop current source 350, which provides a bias current to the first series diode pair D1-D2 and the second series diode pair D5-D6. The first series diode pair D1-D2 is coupled between the first power supply bus VCC and a base of the first translinear loop transistor QPB, and the second series diode pair D5-D6 is coupled between the base of the first translinear loop transistor QPB and the second power supply bus VEE. The second series diode pair D5-D6 produces a voltage that is provided to the base of a first input transistor Q1. The first translinear loop current source 350 is coupled between the second series diode pair D5-D6 and the second power supply bus VEE.

A collector of the first translinear loop transistor QPB is coupled to the base of the second output transistor QN1, and the emitter of first translinear loop transistor QPB is coupled to the base of the first output transistor QP1 and to the emitter of the first driver transistor QPE. Translinear loop action will cause some of the output current (the first output current referred to above) from the first current mirror 320 to divert away from the emitter of the first driver transistor QPE and instead flow into the emitter of first translinear loop transistor QPB. This diversion of current out of the positive feedback path will cause a drop in loop gain. The amount of diverted current into first translinear loop transistor QPB, and the resultant reduction of loop gain, is governed by the ratio of the semiconductor junction sizes of first translinear loop transistor QPB and first driver transistor QPE. By transistor action, the emitter current of first translinear loop transistor QPB is transmitted through its collector and coupled into the base of second output transistor QN1. This coupling preserves signal amplitude coupling from the Class AB pre-driver stage 310 into the output stage 390.

The second translinear loop includes a second translinear loop transistor QNB, a third series diode pair D3-D4, a fourth series diode pair D7-D8 and a second translinear loop current source 355, which provides a bias current to the third series diode pair D3-D4 and the fourth series diode pair D7-D8. The third series diode pair D3-D4 is coupled between the second power supply bus VEE and a base of the second translinear loop transistor QNB, and the fourth series diode pair D7-D8 is coupled between the base of the second translinear loop transistor QNB and the first power supply bus VCC. The fourth series diode pair D7-D8 produces a voltage that is provided to the base of a second input transistor Q2. The second translinear loop current source 355 is coupled between the fourth series diode pair D7-D8 and the first power supply bus VCC.

A collector of the second translinear loop transistor QNB is coupled to the base of the first output transistor QP1, and the emitter of second translinear loop transistor QNB is coupled to the base of the second output transistor QN1 and to the emitter of the second driver transistor QNE. Translinear loop action will cause some of the output current (the second output current referred to above) from the second current mirror 325 to divert away from the emitter of the second driver transistor QNE and instead flow into the emitter of second translinear loop transistor QNB. This diversion of current out of the positive feedback path will cause a drop in loop gain. The amount of diverted current into second translinear loop transistor QNB, and the resultant reduction of loop gain, is governed by the ratio of the semiconductor junction sizes of second translinear loop transistor QNB and second driver transistor QNE. By transistor action, the emitter current of second translinear loop transistor QNB is transmitted through its collector and coupled into the base of the first output transistor QP1. This coupling preserves signal amplitude coupling from Class AB pre-driver stage 310 into output stage 390. The first and second translinear loops further assist with the quiescent currents for the first and second output transistors QP1, QN1, and control the overall loop gain for the amplifier 300.

Figure 4:
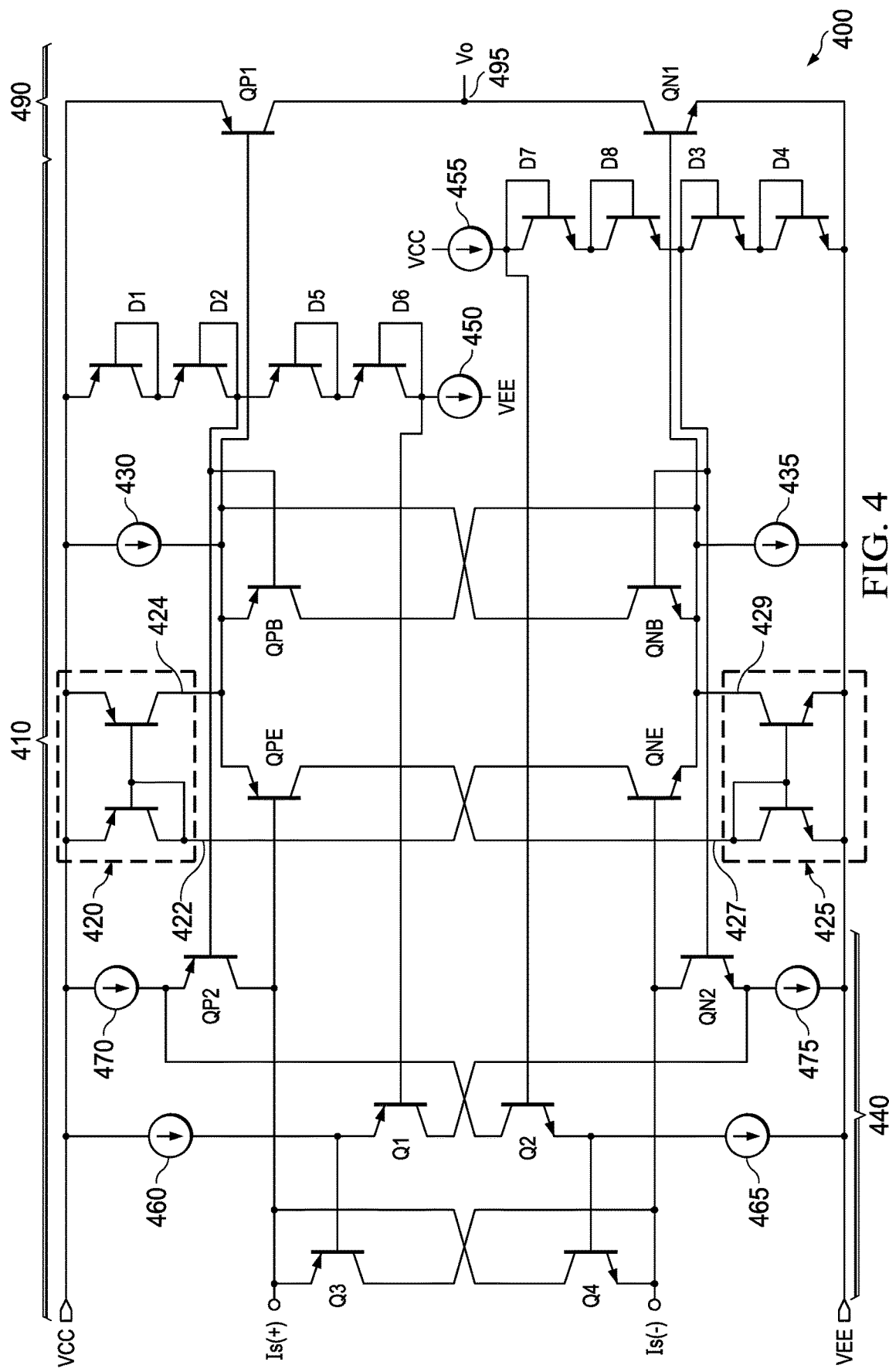

Turning now to FIG. 4, illustrated is a schematic diagram of a portion of an example multi-stage amplifier (also referred to as an amplifier) 400. The amplifier 400 includes a pre-driver stage 410 and an output stage 490 analogous to the amplifier 300 introduced with respect to FIG. 3. The pre-driver stage 410 includes first and second driver transistors QPE, QNE driven by two in-phase input current signals Is(+), Is(−), respectively. The pre-driver stage 410 is made Class AB emitter follower by coupling the currents of the first and second driver transistors QPE, QNE with positive current feedback. The rail-to-rail output stage 490 is formed with a first output transistor QP1 with its emitter coupled to a first power supply bus VCC and a second output transistor QN1 with its emitter coupled to a second power supply bus VEE. The collectors of both the first and second output transistors QP1, QN1 are coupled together and also to an output terminal 495.

The emitter of the first driver transistor QPE (e.g., PNP transistor) is coupled to a base of the first output transistor QP1 and a collector of the first driver transistor QPE is coupled to the second power supply bus VEE. The emitter of the second driver transistor QNE (e.g., NPN transistor) is coupled to a base of the second output transistor QN1 and a collector of the second driver transistor QNE is coupled to the first power supply bus VCC.

Analogous to the amplifier 300 of FIG. 3, a first current source 430 is sized to provide a dc bias current for the first driver transistor QPE and also provides a turn-off current for the first output transistor QP1. The first current source 430 is coupled between the first power supply bus VCC and the base of the first output transistor QP1. A second current source 435 is sized to provide a dc bias current for the second driver transistor QNE and also provide a turn-off current for the second output transistor QN1. The second current source 435 is coupled between the base of the second output transistor QN1 and the second power supply bus VEE. Thus, the pre-driver stage 410 receives the input current signals Is(+), Is (−) and provides low impedance signals to the output stage 490, which transforms the low impedance signals and provides an output signal Vo (e.g., an amplified output signal) at the output terminal 495 of the amplifier 400.

Further analogous to the amplifier 300 of FIG. 3, the pre-driver stage 410 includes first and second current mirrors 420, 425 to bias the pre-driver stage 410 for Class AB operation. The first current mirror 420 has its current sensing branch (a first current sensing branch 422) coupled between the collector of the second driver transistor QNE and the first power supply bus VCC. The first current mirror 420 further has its current output branch (a first current output branch 424) coupled between the emitter of the first driver transistor QPE and the first power supply bus VCC. The second current mirror 425 has its current sensing branch (a second current sensing branch 427) coupled between the collector of first driver transistor QPE and the second power supply bus VEE. The second current mirror 425 further has its current output branch (a second current output branch 429) coupled between the emitter of the second driver transistor QNE and the second power supply bus VEE.

As a current (a first sensed current) in a first current sensing branch 422 of the first current mirror 420 increases, a first current output branch 424 will drive, without limitation, a nearly identical amount of current (a first output current) into the emitter of the first driver transistor QPE. By transistor action, a similar current will flow in the collector of the first driver transistor QPE and in turn be driven into a second current sensing branch 427 of the second current mirror 325. As the current (a second sensed output current) in the second current sensing branch 427 of the second current mirror 425 increases, the second current output branch 429 will drive, without limitation, a nearly identical amount of current (a second output current) into the emitter of the second driver transistor QNE. By transistor action, a similar current will flow in the collector of the second driver transistor QNE and in turn be driven into the first current sensing branch 422 of first current mirror 420. Thus, as set forth above, this combined action creates a positive current feedback and drives apart the dc levels of first and second input current signals Is (+), Is (−), thereby achieving a proper dc bias for Class AB operation of the pre-driver stage 410.

Additionally, the first current mirror 320 is configured to alter a base current of the first output transistor QP1. The second current mirror 325 is configured to alter a base current of the second output transistor QN1. Thus, proper dc bias for Class AB operation of the pre-driver stage 310 is achieved, to control conduction overlap of the first and second output transistors QP1, QN1. Furthermore, the dc bias currents for the pre-driver stage 410 can now be provided by the first and second current mirrors 420, 425 leading to the advantages set forth above with respect to the first and second current sources 430, 435 (see discussion above with respect to the first and second current mirrors 330, 335 of FIG. 3).

Due to the positive feedback mechanism of the first and second current mirrors 420, 425 used to achieve Class AB operation of the pre-driver stage 410, the loop gain at frequencies other than dc can be greater than one (1) and may pose a stability challenge. Further analogous to the amplifier 300 of FIG. 3, first and second translinear loops are added to divert current from a loop formed by the first and second current mirrors 420, 425 to reduce a loop gain thereof to less than one (1).

The first translinear loop includes a first translinear loop transistor QPB, a first series diode pair D1-D2, a second series diode pair D5-D6 and a first translinear loop current source 450, which provides a bias current to the first series diode pair D1-D2 and the second series diode pair D5-D6. The first series diode pair D1-D2 is coupled between the first power supply bus VCC and a base of the first translinear loop transistor QPB, and the second series diode pair D5-D6 is coupled between the base of the first translinear loop transistor QPB and the second power supply bus VEE. The second series diode pair D5-D6 produces a voltage that is provided to the base of a first input transistor Q1. The first translinear loop current source 450 is coupled between the second series diode pair D5-D6 and the second power supply bus VEE.

A collector of the first translinear loop transistor QPB is coupled to the base of the second output transistor QN1, and the emitter of first translinear loop transistor QPB is coupled to the base of the first output transistor QP1 and to the emitter of the first driver transistor QPE. Translinear loop action will cause some of the output current (the first output current referred to above) from the first current mirror 420 to divert away from the emitter of the first driver transistor QPE and instead flow into the emitter of first translinear loop transistor QPB. This diversion of current out of the positive feedback path will cause a drop in loop gain. The amount of diverted current into first translinear loop transistor QPB, and the resultant reduction of loop gain, is governed by the ratio of the semiconductor junction sizes of first translinear loop transistor QPB and first driver transistor QPE. By transistor action, the emitter current of first translinear loop transistor QPB is transmitted through its collector and coupled into the base of second output transistor QN1. This coupling preserves signal amplitude coupling from the Class AB pre-driver stage 410 into the output stage 490.

The second translinear loop includes a second translinear loop transistor QNB, a third series diode pair D3-D4, a fourth series diode pair D7-D8 and a second translinear loop current source 455, which provides a bias current to the third series diode pair D3-D4 and the fourth series diode pair D7-D8. The third series diode pair D3-D4 is coupled between the second power supply bus VEE and a base of the second translinear loop transistor QNB, and the fourth series diode pair D7-D8 is coupled between the base of the second translinear loop transistor QNB and the first power supply bus VCC. The fourth series diode pair D7-D8 produces a voltage that is provided to the base of a second input transistor Q2. The second translinear loop current source 455 is coupled between the fourth series diode pair D7-D8 and the first power supply bus VCC.

A collector of the second translinear loop transistor QNB is coupled to the base of the first output transistor QP1, and the emitter of second translinear loop transistor QNB is coupled to the base of the second output transistor QN1 and to the emitter of the second driver transistor QNE. Translinear loop action will cause some of the output current (the second output current referred to above) from the second current mirror 425 to divert away from the emitter of the second driver transistor QNE and instead flow into the emitter of second translinear loop transistor QNB. This diversion of current out of the positive feedback path will cause a drop in loop gain. The amount of diverted current into second translinear loop transistor QNB, and the resultant reduction of loop gain, is governed by the ratio of the semiconductor junction sizes of second translinear loop transistor QNB and second driver transistor QNE. By transistor action, the emitter current of second translinear loop transistor QNB is transmitted through its collector and coupled into the base of the first output transistor QP1. This coupling preserves signal amplitude coupling from Class AB pre-driver stage 410 into output stage 490. The first and second translinear loops further assist with the quiescent currents for the first and second output transistors QP1, QN1, and control the overall loop gain for the amplifier 400.

The pre-driver stage 410 also includes a front-end 440 including first, second, third and fourth input transistors Q1, Q2, Q3, Q4 to receive the input current signals Is(+), Is(−) and provide input signals to the first and/or second driver transistors QPE, QNE. The base of the third input transistor Q3 is coupled to the emitter of the first input transistor Q1, and the base of the first input transistor Q1 is coupled to the second series diode pair D5-D6, thereby establishing a dc voltage level for the first input current signal Is(+). The base of the fourth input transistor Q4 is coupled to the emitter of the second input transistor Q2, and the base of the second input transistor Q2 is coupled to the fourth series diode pair D7-D8, thereby establishing a dc voltage level for the second input current signal Is(−). A first and second input current source 460, 465 provide a bias current for the first and second transistors Q1, Q2, respectively.

The front-end 440 also includes a first leakage current transistor QP2 that cooperates with the second input transistor Q2 to substantially cancel a base current of the fourth input transistor Q4, which increases an impedance at the input node for the second input current signal Is(−). In operation, the base current of the fourth input transistor Q4 goes through the emitter of the second input transistor Q2 (since the second input current source 465 is a fixed current source), and then through the emitter of the first leakage current transistor QP2 (since a third input current source 470 is a fixed current source) and then into the input node for the first input current signal Is(+). Thus, the base current of the fourth input transistor Q4 is recirculated back into the signal path, thereby effectively canceling the base current of the fourth input transistor Q4. With the base current of the fourth input transistor Q4 canceled, the impedance presented to the input node for the second input current signal Is(−) is substantially increased, thereby obtaining a higher dc gain. The first leakage current transistor QP2, therefore, facilitates recovery of leakage current from the fourth input transistor Q4.

The front-end 440 also includes a second leakage current transistor QN2 that cooperates with the first input transistor Q1 to substantially cancel a base current of the third input transistor Q3, which increases an impedance at the input node for the first input current signal Is(+). In operation, the base current of the third input transistor Q3 goes through the emitter of the first input transistor Q1 (since the first input current source 460 is a fixed current source), and then through the emitter of the second leakage current transistor QN2 (since a fourth input current source 475 is a fixed current source) and then into the input node for the second input current signal Is(−). Thus, the base current of the third input transistor Q3 is recirculated back into the signal path, thereby effectively canceling the base current of the third input transistor Q3. With the base current of the third input transistor Q3 canceled, the impedance presented to the input node for the first input current signal Is(+) is substantially increased, thereby obtaining a higher dc gain. The second leakage current transistor QP1, therefore, facilitates recovery of leakage current from the third input transistor Q3.

If the first input transistor Q1 was omitted, the base of the third input transistor Q3 would be coupled to diode D5 instead of diode D6. However, the base-emitter resistance of third input transistor Q3 loads the input node for the first input current signal Is(+), thereby producing a current leakage path for the base current of the third input transistor Q3. Thus, the first input transistor Q1 (and diode D6) are incorporated into the front-end 440 in cooperation with the second leakage current transistor QN2 to form a leakage current arrangement as described above to substantial cancel the base current for the third input transistor Q3.

Similarly, if the second input transistor Q2 was omitted, the base of the fourth input transistor Q4 would be coupled to diode D8 instead of diode D7. However, the base-emitter resistance of fourth input transistor Q4 loads the input node for the second input current signal Is (−), thereby producing a current leakage path for the base current of the fourth input transistor Q2. Thus, the second input transistor Q2 (and diode D7) are incorporated into the front-end 440 in cooperation with the first leakage current transistor QP2 to form a leakage current arrangement as described above to substantial cancel the base current for the fourth input transistor Q4.

Figure 5:
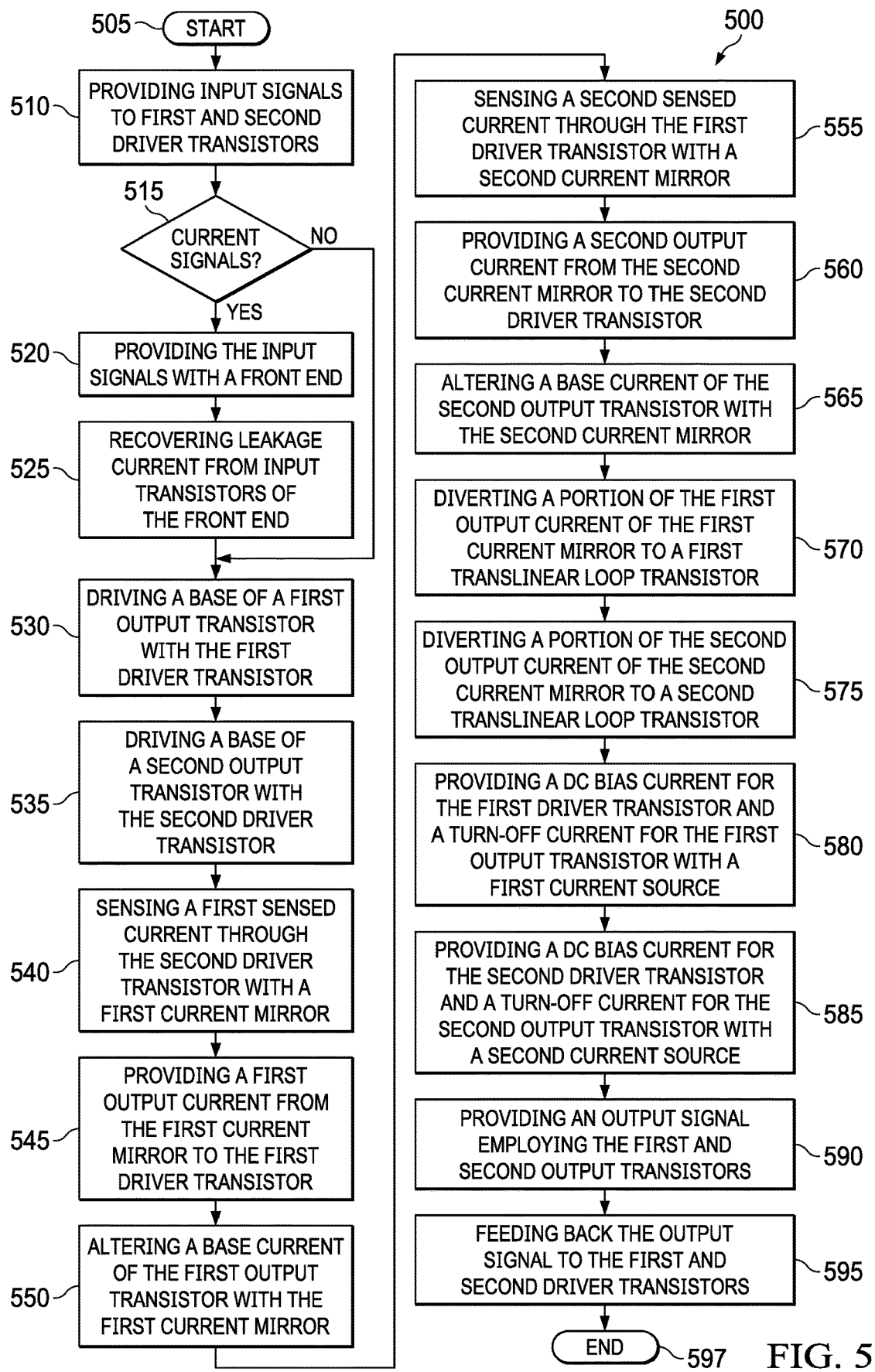
FIG. 5 illustrates a flow diagram of an example of a method of operating a multi-stage amplifier.

Turning now to FIG. 5 and with continuing reference to the preceding FIGUREs, illustrated is a flow diagram of an example of a method 500 of operating a multi-stage amplifier 200, 300, 400. The method 500 begins at a start step or module 505. At a step or module 510, the method 500 includes providing input signals to ones of first and second driver transistors QPE, QNE. At a decisional step or module 515, the method determines if the input signals are current input signals. If the input signals are current input signals, the method 500 includes providing the input signals to ones of first and second driver transistors QPE, QNE with a front-end 440 including a first input transistor Q1, a second input transistor Q2, a third input transistor Q3 and a fourth input transistor Q4 at a step or module 520. The method 500 also includes recovering leakage current from ones of the third input transistor Q3 and the fourth input transistor Q4 with a first leakage current transistor QP2 and a second leakage current transistor QN2 at a step or module 525. The method 500 then proceeds to the step or module 530.

If the input signals are not current input signals or following the step or module 525 (if the input signals are current input signals), the method 500 includes driving a base of a first output transistor QP1 coupled to an output terminal 295, 395, 495 of the amplifier 200, 300, 400 with the first driver transistor QPE at a step or module 530. At a step or module 535, the method 500 includes driving a base of an oppositely doped second output transistor QN1 coupled to the output terminal 295, 395, 495 with the second driver transistor QNE.

At a step or module 540, the method 500 includes sensing a first sensed current flowing through a collector of the second driver transistor QNE with a first current sensing branch 322, 422 of a first current mirror 320, 420. At a step or module 545, the method 500 includes providing a first output current from a first current output branch 324, 424 of the first current mirror 320, 420 to an emitter of the first driver transistor QPE. At a step or module 550, the method 500 includes altering a base current of the first output transistor QP1 with the first current mirror 320, 420.

At a step or module 555, the method 500 includes sensing a second sensed current flowing through a collector of the first driver transistor QPE with a second current sensing branch 327, 427 of a second current mirror 325, 425. At a step or module 560, the method 500 includes providing a second output current from a second current output branch 329, 429 of the second current mirror 325, 425 to an emitter of the second driver transistor QNE. At a step or module 565, the method 500 includes altering a base current of the second output transistor QN1 with the second current mirror 325, 425.

At a step or module 570, the method 500 includes diverting a portion of the first output current from the first current output branch 324, 424 of the first current mirror 320, 420 from the first driver transistor QPE to an emitter of a first translinear loop transistor QPB. At a step or module 575, the method 500 includes diverting a portion of the second output current from the second current output branch 329, 429 of the second current mirror 325, 425 from the second driver transistor QNE to an emitter of a second translinear loop transistor QNB.

At a step or module 580, the method 500 includes providing a dc bias current for the first driver transistor QPE and a turn-off current for the first output transistor QP1 with a first current source 230, 330, 430. At a step or module 585, the method 500 includes providing a dc bias current for the second driver transistor QNE and a turn-off current for the second output transistor QN1 with a second current source 235, 335, 435. At a step or module 590, the method 500 includes providing an output signal Vo at the output terminal 295, 395, 495 of the amplifier 200, 300, 400 employing the first output transistor QP1 and the second output transistor QN1. At a step or module 595, the method 500 includes feeding back the output signal Vo at the output terminal 295, 395, 495 to a base of the first driver transistor QPE and a base of the second driver transistor QNE with a feedback loop. The method 500 concludes at an end step or module 597.

Although the present disclosure has been described in detail, various changes, substitutions and alterations may be made without departing from the spirit and scope of the disclosure in its broadest form. For instance, the circuit elements described herein may be discrete electronic components constructed and separately mounted onto a suitable physical substrate. The circuit elements may further be constructed onto the same monolithic bipolar transistor semiconductor substrate.

Moreover, the scope of the present application is not intended to be limited to the particular examples of the process, machine, manufacture, composition of matter, means, methods and steps described in the specification. The processes, machines, manufacture, compositions of matter, means, methods, or steps, presently existing or later to be developed, that perform substantially the same function or achieve substantially the same result as the corresponding examples described herein may be utilized according to the present disclosure. Accordingly, the appended claims are intended to include within their scope such processes, machines, manufacture, compositions of matter, means, methods, or steps.

What is claimed is:

1. An amplifier, comprising:
   an output stage including a first output transistor having a collector coupled to a collector of an oppositely doped second output transistor and to an output terminal; and
   a pre-driver stage, including:
   a first driver transistor having an emitter coupled to a base of the first output transistor,
   a second driver transistor having an emitter coupled to a base of the second output transistor;
   a first current mirror including a first current sensing branch coupled to a collector of the second driver transistor and a first current output branch coupled to an emitter of the first driver transistor,
   a second current mirror including a second current sensing branch coupled to a collector of the first driver transistor and a second current output branch coupled to an emitter of the second driver transistor, a first translinear loop including:
  a first translinear loop transistor with an emitter coupled to the base of the first output transistor and a collector coupled to the base of the second output transistor,
  a first series diode pair coupled between a first power supply bus and a base of the first translinear loop transistor, and
  a second series diode pair coupled between the base of the first translinear loop transistor and a second power supply bus, and
a second translinear loop including:
  a second translinear loop transistor with an emitter coupled to the base of the second output transistor and a collector coupled to the base of the first output transistor,
  a third series diode pair coupled between the second power supply bus and a base of the second translinear loop transistor, and
  a fourth series diode pair coupled between the base of the second translinear loop transistor and the first power supply bus.

2. The amplifier as recited in claim 1, wherein:
the first current mirror is configured to alter a base current of the first output transistor, and
the second current mirror is configured to alter a base current of the second output transistor.

3. The amplifier as recited in claim 1, wherein the first current mirror is coupled to the first power supply bus, and the second current mirror is coupled to the second power supply bus.

4. The amplifier as recited in claim 1, further comprising:
a first current source coupled between the first power supply bus and a base of the first output transistor; and
a second current source coupled between a base of the second output transistor and the second power supply bus.

5. The amplifier as recited in claim 4, wherein the first current source is configured to provide a dc bias current for the first driver transistor and a turn-off current for the first output transistor.

6. The amplifier as recited in claim 4, wherein the second current source is configured to provide a dc bias current for the second driver transistor and a turn-off current for the second output transistor.

7. The amplifier as recited in claim 1, wherein the first translinear loop includes a first translinear loop current source coupled between the second series diode pair and the second power supply bus.

8. The amplifier as recited in claim 1, wherein the first translinear loop is configured to divert current from a loop formed by the first current mirror and the second current mirror to reduce a loop gain to less than one (1).

9. The amplifier as recited in claim 1, wherein the second translinear loop includes a second translinear loop current source coupled between the fourth series diode pair and the first power supply bus.

10. The amplifier as recited in claim 9, wherein the second translinear loop is configured to divert current from a loop formed by the first current mirror and the second current mirror to reduce a loop gain to less than one (1).

11. The amplifier as recited in claim 1, further comprising a front-end including a first input transistor, a second input transistor, a third input transistor and a fourth input transistor to provide input signals to ones of the first and second driver transistors.

12. The amplifier as recited in claim 11, wherein the front-end further includes a first leakage current transistor and a second leakage current transistor that recover leakage current from ones of the third input transistor and the fourth input transistor.

13. A method of operating an amplifier, comprising:
driving a base of a first output transistor coupled to an output terminal of the amplifier with a first driver transistor;
driving a base of an oppositely doped second output transistor coupled to the output terminal with a second driver transistor;
sensing a first sensed current flowing through a collector of the second driver transistor with a first current sensing branch of a first current mirror;
providing a first output current from a first current output branch of the first current mirror to an emitter of the first driver transistor;
sensing a second sensed current flowing through a collector of the first driver transistor with a second current sensing branch of a second current mirror;
providing a second output current from a second current output branch of the second current mirror to an emitter of the second driver transistor;
diverting a portion of the first output current from the first current output branch of the first current mirror from the first driver transistor to an emitter of a first translinear loop transistor;
diverting a portion of the second output current from the second current output branch of the second current mirror from the second driver transistor to an emitter of a second translinear loop transistor;
providing an output signal at the output terminal of the amplifier employing the first output transistor and the second output transistor; and
providing a dc bias current for the first driver transistor and a turn-off current for the first output transistor with a first current source.

14. A method of operating an amplifier, comprising:
driving a base of a first output transistor coupled to an output terminal of the amplifier with a first driver transistor;
driving a base of an oppositely doped second output transistor coupled to the output terminal with a second driver transistor;
sensing a first sensed current flowing through a collector of the second driver transistor with a first current sensing branch of a first current mirror;
providing a first output current from a first current output branch of the first current mirror to an emitter of the first driver transistor;
sensing a second sensed current flowing through a collector of the first driver transistor with a second current sensing branch of a second current mirror;
providing a second output current from a second current output branch of the second current mirror to an emitter of the second driver transistor;
diverting a portion of the first output current from the first current output branch of the first current mirror from the first driver transistor to an emitter of a first translinear loop transistor;
diverting a portion of the second output current from the second current output branch of the second current mirror from the second driver transistor to an emitter of a second translinear loop transistor;

providing an output signal at the output terminal of the amplifier employing the first output transistor and the second output transistor; and providing a dc bias current for the second driver transistor and a turn-off current for the second output transistor with a second current source.

15. A method of operating an amplifier, comprising:

driving a base of a first output transistor coupled to an output terminal of the amplifier with a first driver transistor;

driving a base of an oppositely doped second output transistor coupled to the output terminal with a second driver transistor;

sensing a first sensed current flowing through a collector of the second driver transistor with a first current sensing branch of a first current mirror;

providing a first output current from a first current output branch of the first current mirror to an emitter of the first driver transistor;

sensing a second sensed current flowing through a collector of the first driver transistor with a second current sensing branch of a second current mirror;

providing a second output current from a second current output branch of the second current mirror to an emitter of the second driver transistor;

diverting a portion of the first output current from the first current output branch of the first current mirror from the first driver transistor to an emitter of a first translinear loop transistor;

diverting a portion of the second output current from the second current output branch of the second current mirror from the second driver transistor to an emitter of a second translinear loop transistor;

providing an output signal at the output terminal of the amplifier employing the first output transistor and the second output transistor; and feeding back the output signal at the output terminal to a base of the first driver transistor and a base of the second driver transistor with a feedback loop.

16. A method of operating an amplifier, comprising:

driving a base of a first output transistor coupled to an output terminal of the amplifier with a first driver transistor;

driving a base of an oppositely doped second output transistor coupled to the output terminal with a second driver transistor;

sensing a first sensed current flowing through a collector of the second driver transistor with a first current sensing branch of a first current mirror;

providing a first output current from a first current output branch of the first current mirror to an emitter of the first driver transistor;

sensing a second sensed current flowing through a collector of the first driver transistor with a second current sensing branch of a second current mirror;

providing a second output current from a second current output branch of the second current mirror to an emitter of the second driver transistor;

diverting a portion of the first output current from the first current output branch of the first current mirror from the first driver transistor to an emitter of a first translinear loop transistor;

diverting a portion of the second output current from the second current output branch of the second current mirror from the second driver transistor to an emitter of a second translinear loop transistor;

providing an output signal at the output terminal of the amplifier employing the first output transistor and the second output transistor; and providing input signals to ones of the first and second driver transistors with a front-end including a first input transistor, a second input transistor, a third input transistor and a fourth input transistor.

17. The method as recited in claim 16 further comprising recovering leakage current from ones of the third input transistor and the fourth input transistor with a first leakage current transistor and a second leakage current transistor.

* * * * *